(12) United States Patent
Shin et al.

(10) Patent No.: US 11,037,516 B2
(45) Date of Patent: Jun. 15, 2021

(54) DISPLAY DEVICE

(71) Applicant: Samsung Display Co., Ltd., Yongin-Si (KR)

(72) Inventors: Dong Hee Shin, Asan-si (KR); Geun Ho Lee, Hwaseong-si (KR); Yong Hee Lee, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/828,890

(22) Filed: Mar. 24, 2020

(65) Prior Publication Data

US 2021/0118395 A1 Apr. 22, 2021

(30) Foreign Application Priority Data

Oct. 16, 2019 (KR) .................. 10-2019-0128563

(51) Int. Cl.
  *G09G 3/36* (2006.01)
  *G02F 1/1362* (2006.01)

(52) U.S. Cl.
  CPC ..... *G09G 3/3688* (2013.01); *G02F 1/136286* (2013.01)

(58) Field of Classification Search
  None
  See application file for complete search history.

(56) References Cited

U.S. PATENT DOCUMENTS

| | | | |
|---|---|---|---|
| 2007/0018680 A1* | 1/2007 | Jeon | G09G 3/006 324/750.3 |
| 2008/0001895 A1* | 1/2008 | Choi | G09G 3/3648 345/98 |
| 2015/0103500 A1 | 4/2015 | Bae et al. | |
| 2019/0245283 A1 | 8/2019 | Oh | |
| 2019/0311683 A1 | 10/2019 | Park et al. | |
| 2019/0312095 A1 | 10/2019 | Park et al. | |

FOREIGN PATENT DOCUMENTS

| | | |
|---|---|---|
| JP | 2000-242194 A | 9/2000 |
| KR | 10-1010129 B1 | 1/2011 |
| KR | 10-1084877 B1 | 11/2011 |
| KR | 10-2017-0038338 A | 4/2017 |
| KR | 10-2018-0027692 A | 3/2018 |

* cited by examiner

*Primary Examiner* — Edward J Glick
*Assistant Examiner* — David Y Chung
(74) *Attorney, Agent, or Firm* — Innovation Counsel LLP

(57) ABSTRACT

A display device includes a display panel including a display area and a peripheral area; a data pad portion transferring a data voltage; and a control pad portion transferring a control voltage, the data pad portion includes: a first data pad portion in a first row of the first pad portion, a second data pad portion in a second row of the first pad portion; a third data pad portion in a first row of a second pad portion; and a fourth data pad portion in a second row of the second pad portion, and the control pad portion includes: a first control pad portion at a left side of the second data pad portion in the second row of the first pad portion; and a second control pad portion at a right side of the fourth data pad portion in the second row of the second pad portion.

23 Claims, 10 Drawing Sheets

DISPLAY DEVICE

CROSS-REFERENCE TO RELATED APPLICATION

This application claims priority to and benefit of Korean Patent Application No. 10-2019-0128563 filed in the Korean Intellectual Property Office on Oct. 16, 2019, the entire contents of the Korean Patent Application which are incorporated herein by reference.

BACKGROUND

1. Field

The technical field relates to a display device.

2. Description of the Related Art

A display device displays an image, and includes a liquid crystal display, an organic light emitting diode display, and the like. Display devices is used in various electronic devices such as mobile phones, navigation units, digital cameras, electronic books, portable game machines, and various terminals.

Display devices include a display panel including a plurality of pixels and a driver for supplying a signal to the pixels. A plurality of gate lines and a plurality of data lines are formed in the display panel, and each of the pixels is connected to a gate line and a data line to receive a signal. The driver may include a gate driver and a data driver. The gate line receives a gate signal from the gate driver, and the data line receives a data voltage from the data driver.

At least some of these drivers may be formed as integrated circuit chips (IC chips), and the integrated circuit chips may be mounted on a chip-on-film (COF) package and attached to one edge of the display panel. A plurality of pads is disposed in the display panel corresponding to a portion to which the film is attached, and the pads may be electrically connected to the film. A gap between adjacent pads should be large enough to prevent short-circuits between the pads.

As resolution of the display devices has gradually increased, so have the number of pads in the display devices, thereby reducing the gap between the pads and a gap between the films.

The above information disclosed in this Background section is only for enhancement of understanding of the background of the described technology and therefore it may contain information that does not form the prior art that is already known in this country to a person of ordinary skill in the art.

SUMMARY

Embodiments have been made in an effort to provide a display device capable of securing a gap between pads and preventing an increase in process cost while securing an interval between films.

An embodiment provides a display device including: a display panel comprising a display area and a peripheral area disposed at an edge of the display area; a data pad portion positioned on the peripheral area of the display panel and configured to transfer a data voltage; and a control pad portion positioned on the peripheral area of the display panel and configured to transfer a control voltage, wherein the data pad portion includes: a first data pad portion positioned in a first row of the first pad portion; a second data pad portion positioned in a second row below the first row of the first pad portion; a third data pad portion positioned in a first row of a second pad portion adjacent to the first pad portion in a row direction; and a fourth data pad portion positioned in a second row below the first row of the second pad portion, and the control pad portion includes: a first control pad portion positioned at a left side of the second data pad portion in the second row of the first pad portion; and a second control pad portion positioned at a right side of the fourth data pad portion in the second row of the second pad portion.

The first data pad portion may be adjacent to the third data pad portion, and the second data pad portion may be adjacent to the fourth data pad portion.

The control pad portion may not be positioned in a first row of the first pad portion and not positioned in a first row of the second pad portion.

The control pad portion may not be positioned at a right side of the second data pad portion in the second row of the first pad portion, and may not be positioned at a left side of the second data pad portion in the second row of the second pad portion.

The first row of the first pad portion and the first row of the second pad portion may be adjacent in a row direction, and the second row of the first pad portion and the second row of the second pad portion may be adjacent in the row direction.

According to the embodiment, the display device may further include a first alignment key positioned at a left side of the first data pad portion, in the first row of the first pad portion, and adjacent to the first control pad portion.

According to the embodiment, the display device may further include a second alignment key positioned at a right side of the third data pad portion, in the first row of the second pad portion, and adjacent to the second control pad portion.

The display device may include a plurality of first pad portions and a plurality of second pad portions, and the plurality of first pad portions and the plurality of second pad portions may be alternately positioned in the row direction.

The second control pad portion of the second pad portion may be adjacent to the first control pad portion of the first pad portion.

The first pad portion may be positioned at a left edge of the peripheral area, and the second pad portion may be positioned at a right edge of the peripheral area.

A sum of a number of the first pad portions and a number of the second pad portions may be an even number.

The display device may include a plurality of first pad portions, the plurality of first pad portions may be positioned in a line, and the second pad portion may be positioned adjacent to edges of the first pad portions.

The second pad portion may be positioned at a right edge of the peripheral area.

According to the embodiment, the display device may further include: a first printed circuit film overlapping the first pad portion; and a second printed circuit film overlapping the second pad portion.

The first printed circuit film may include: a first film overlapping the first data pad portion; and a second film overlapping the second data pad portion and the first control pad portion, and the second printed circuit film may include: a third film overlapping the third data pad portion; and a fourth film overlapping the fourth data pad portion and the second control pad portion.

The first printed circuit film may be formed as a single film, and the second printed circuit film may be formed as a single film.

The control pad portion is configured to receive at least one of a clock signal, a low voltage signal, a scan start signal, a common voltage, and a storage voltage.

The data pad portion is configured to receive a data voltage.

A structure of the first pad portion may be symmetric with respect to a structure of the second pad portion.

According to the embodiment, the display device may further include: a display panel comprising a display area and a peripheral area disposed at an edge of the display area; a first pad portion positioned on the peripheral area of the display panel; and a second pad portion positioned on the peripheral area of the display panel to be adjacent to the first pad portion in a row direction, and to have a symmetrical structure with respect to the first pad portion, and the first pad portion may include: a first data pad portion positioned in a first row; a second data pad portion positioned in a second row below a first row of the first pad portion to be adjacent to the first data pad portion; and a first control pad portion positioned in the second row of the first pad portion and positioned at a left side of the second data pad portion, while the second pad portion may include: a third data pad portion positioned in a first row; a fourth data pad portion positioned in a second row below the first row of the second pad portion to be adjacent to the third data pad portion; and a second control pad portion positioned in the second row of the second pad portion and positioned at a right side of the fourth data pad portion.

The first data pad portion may be adjacent to the third data pad portion, the second data pad portion may be adjacent to the fourth data pad portion, the first data pad portion and the second data pad portion may be positioned at a right edge of the first pad portion, and the third data pad portion and the fourth data pad portion may be positioned at a left edge of the second pad portion.

According to the embodiment, the display device may further include: a first alignment key positioned at a left side of the first data pad portion in the first row of the first pad portion to be adjacent to the first control pad portion; and a second alignment key positioned at a right side of the third data pad portion in the first row of the second pad portion to be adjacent to the second control pad portion.

According to the embodiment, the display device may further include: a first printed circuit film overlapping the first pad portion; and a second printed circuit film overlapping the second pad portion.

According to the embodiments, the interval between the pads and the interval between the films may be secured while preventing an increase in the process cost by arranging pads in one row and two rows in one pad portion, dualizing the pad portion into the first pad portion and the second pad portion, and disposing the control pad portion only at the left side of the first pad portion and the right side of the second pad portion.

DETAILED DESCRIPTION

Figure 1:
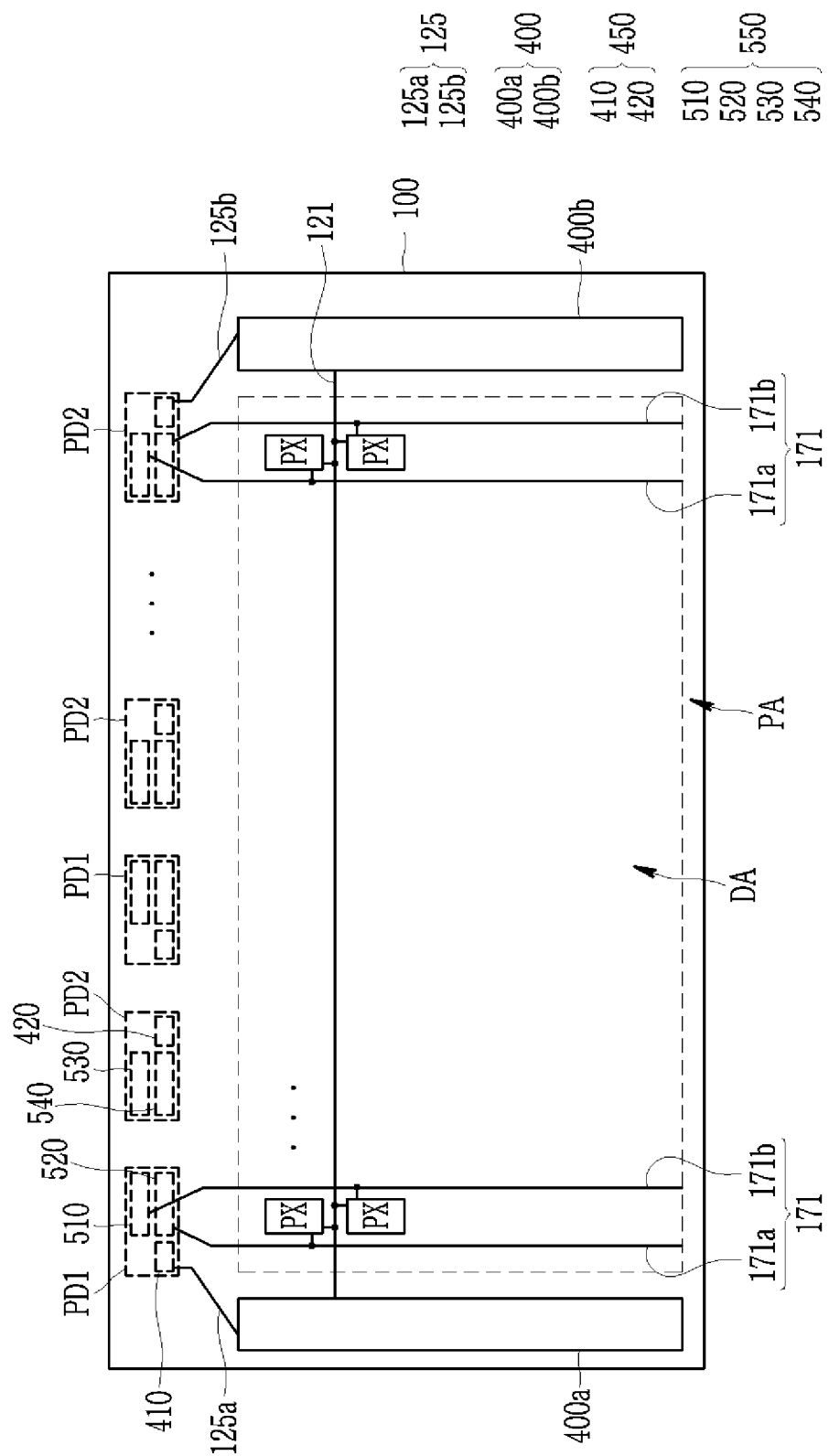
FIG. 1 illustrates a schematic block diagram of a display device according to an embodiment.

The present inventive concept will be described more fully hereinafter with reference to the accompanying drawings, in which embodiments of the inventive concept are shown. As those skilled in the art would realize in light of the present specification, the described embodiments may be modified in various different ways, all without departing from the spirit or scope of the present inventive concept.

To clearly describe the present inventive concept, parts that are irrelevant to the description are omitted, and like numerals may refer to like or similar constituent elements throughout the specification.

Further, since sizes and thicknesses of constituent members shown in the accompanying drawings are illustratively given for better understanding and ease of description, the present inventive concept is not limited to the illustrated sizes and thicknesses. In the drawings, dimensions of elements may be exaggerated for clarity.

When a first element is referred to as being "on" a second element, the first element can be directly on the second element, or one or more intervening elements may be present between the first element and the second element. When a first element is referred to as being "directly on" a second element, there are no intended intervening elements (except environmental elements such as air) present between the first element and the second element. In the present specification, unless explicitly described to the contrary, the word "comprise" and variations such as "comprises" or "comprising" may imply the inclusion of stated elements but may not require the exclusion of any other elements. Further, in the specification, the phrase "in a plan view" means when an object portion is viewed from above, and the phrase "in a cross-section" means when a cross-section taken by vertically cutting an object portion is viewed from the side.

Further, in the specification, the orientations "left" and "right" refer to the orientation when each figure is viewed in its intended viewing orientation (e.g. when the word "FIG." is upright and not rotated). For example, since FIG. 1 in this specification is rotated 90 degrees to the right in order to fit onto its page, "left" in FIG. 1 refers to the bottom of the page (or towards the bottom of the page) while "right" refers to the top of the page (or towards the top of the page). If FIG. 1 and its page were rotated 90 degrees to the left to be viewed in its intended viewing orientation, then "left" and "right" would correspond to the left and right of the rotated page. This clarification may apply to other relative orientations, such as "above," "below," "upper," "lower", and the like.

The term "connect" may mean "electrically connect." The term "insulate" may mean "electrically insulate."

First, a display device according to an embodiment will be described with reference to FIG. 1 to FIG. 6.

Figure 2:
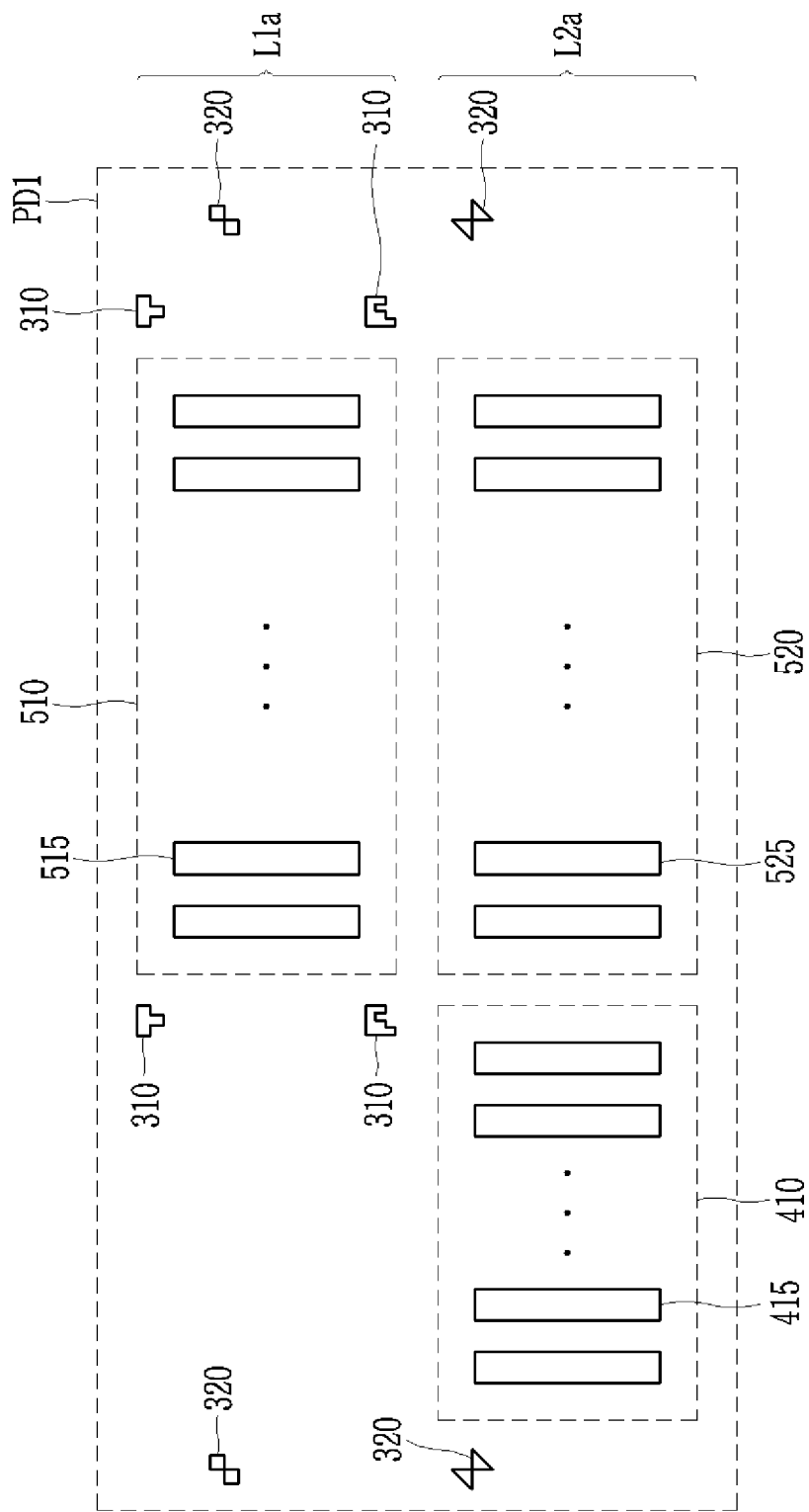
FIG. 2 illustrates an enlarged view of a first pad portion of a display device according to an embodiment.
Figure 3:
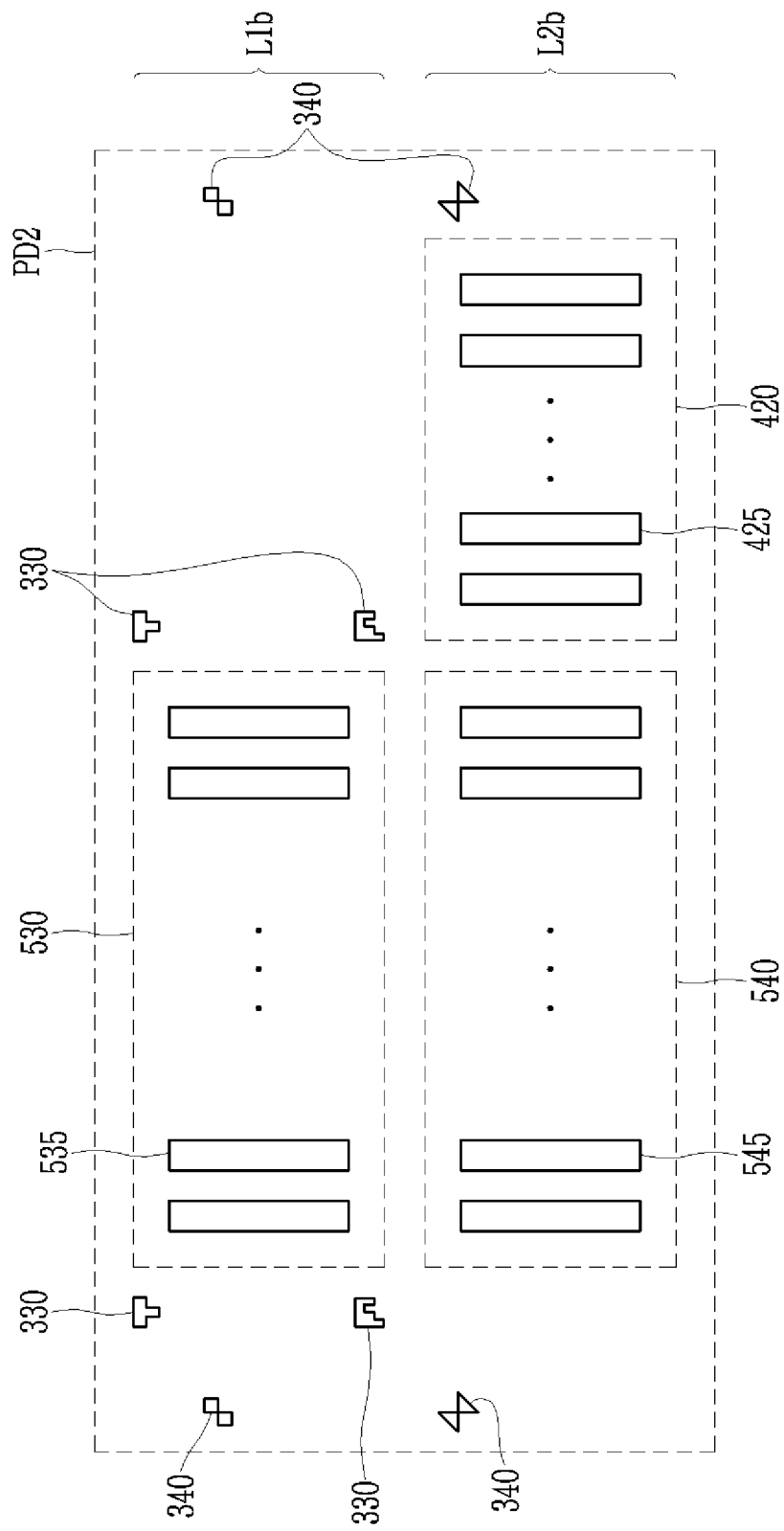
FIG. 3 illustrates an enlarged view of a second pad portion of a display device according to an embodiment.
Figure 4:
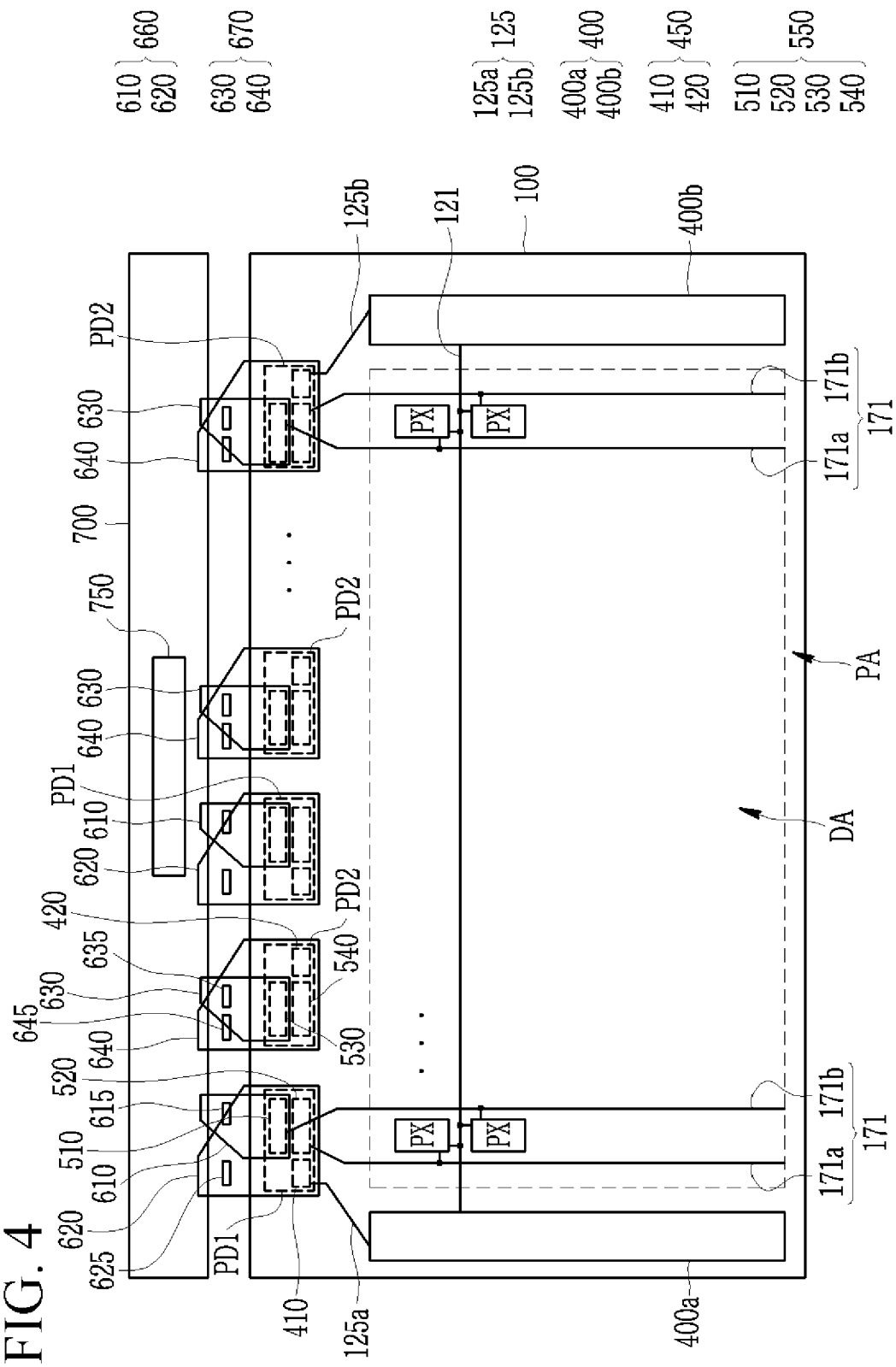
FIG. 4 illustrates a schematic block diagram of a display device according to an embodiment.
Figure 5:
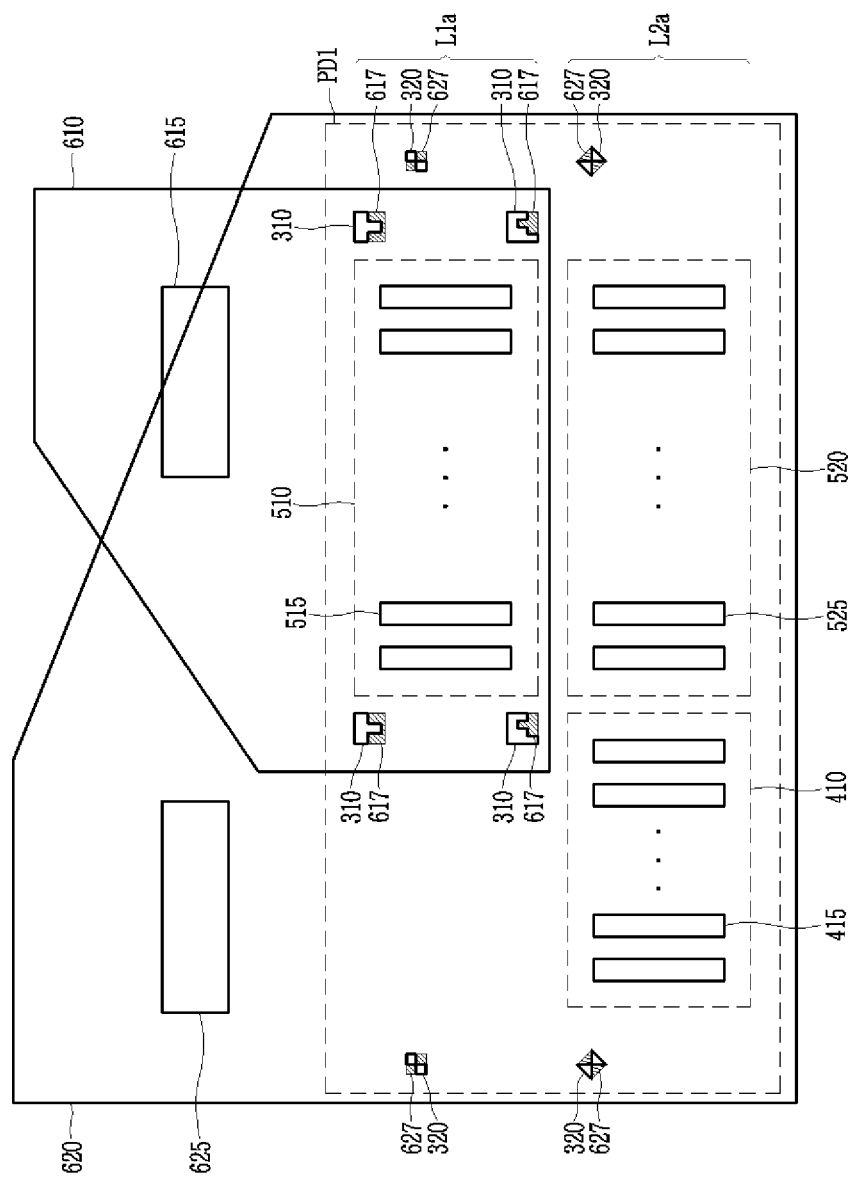
FIG. 5 illustrates an enlarged view of a first pad portion and a peripheral portion in a display device according to an embodiment.
Figure 6:
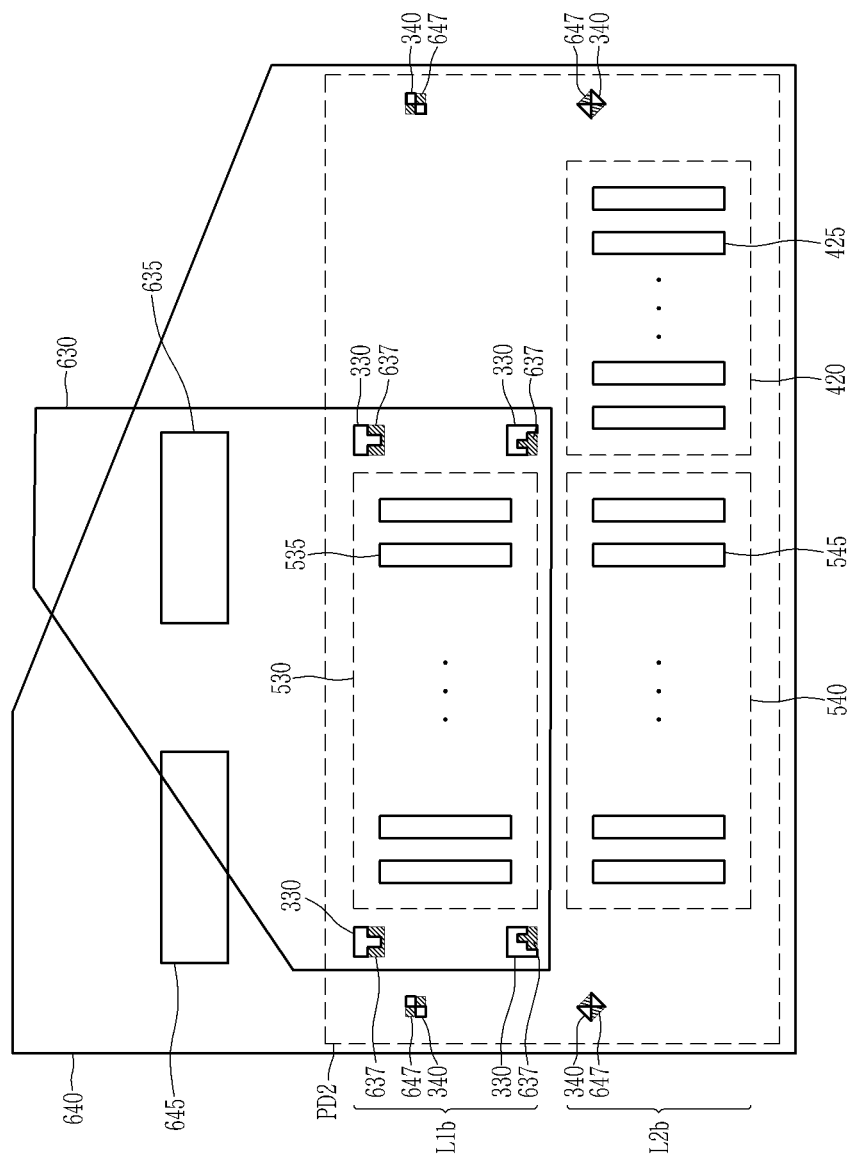
FIG. 6 illustrates an enlarged view of a second pad portion and a peripheral portion in a display device according to an embodiment.

FIG. 1 to FIG. 3 illustrate a display device before a first printed circuit film, a second printed circuit film, a third printed circuit film, and a fourth printed circuit film are attached to the display device according to an embodiment. In addition, FIG. 4 to FIG. 6 illustrate the display device after the first to fourth printed circuit films are attached to the display device according to an embodiment.

Hereinafter, the display device before the first to fourth printed circuit films are attached to the display device will be described with reference to FIG. 1 to FIG. 3.

FIG. 1 illustrates a schematic block diagram of a display device according to an embodiment, FIG. 2 illustrates an enlarged view of a first pad portion of a display device according to an embodiment, and FIG. 3 illustrates an enlarged view of a second pad portion of a display device according to an embodiment.

As illustrated in FIG. 1, a display device according to an embodiment includes a display panel 100 including a display area DA and a peripheral area PA, and a first pad portion PD1 and a second pad portion PD2 both positioned in the peripheral area PA of the display panel 100.

The display panel 100 may have various elements disposed on a substrate made of a material such as transparent glass or plastic. The display panel 100 may be any of various display panels such as a liquid crystal display panel and an organic light emitting display panel. The display panel 100 may include the display area DA on which an image is displayed, and the peripheral area PA in which a driving circuit for driving the display area DA is mounted.

The peripheral area PA of the display panel 100 may surround the display area DA. For example, the display panel 100 may have a substantially rectangular shape, and the display area DA may be a rectangle positioned at a center of the display panel 100. In this case, the peripheral area PA is positioned outside an upper edge, a left edge, a right edge, and a lower edge of the display area DA to surround the display area DA.

The first pad portion PD1 and the second pad portion PD2 may be positioned in the peripheral area PA of the display panel 100. The first pad portion PD1 and the second pad portion PD2 may be positioned outside the upper edge of the display area DA of the display panel 100. However, the positions of the first pad portion PD1 and the second pad portion PD2 are just one example. For example, the first pad portion PD1 and the second pad portion PD2 may be positioned outside the lower edge of the display area DA of the display panel 100. In addition, the first pad portion PD1 and the second pad portion PD2 may be positioned outside the upper edge and the lower edge of the display area DA of the display panel 100.

A plurality of first pad portions PD1 and a plurality of second pad portions PD2 may be positioned in the peripheral area PA of the display panel 100. The plurality of first pad portions PD1 and the plurality of second pad portions PD2 may be alternately disposed along one direction. As illustrated in FIG. 1, the first pad portion PD1 may be positioned at a left edge of the peripheral area PA positioned above the display area DA. The second pad portion PD2 may be positioned adjacent to a right side of the first pad portion PD1. Subsequently, the first pad portion PD1 and the second pad portion PD2 may be sequentially alternately arranged. In this case, the second pad portion PD2 may be positioned at a right edge of the peripheral area PA positioned above the display area DA.

The first pad portion PD1 may be disposed at a first edge of the peripheral area PA of the display panel 100, and the second pad portion PD2 may be disposed at a second edge of the display panel 100. A sum of a number of the first pad portions PD1 and a number of the second pad portions PD2 may be an even number. In this case, when the first pad portions PD1 and the second pad portions PD2 are alternately arranged, the number of the first pad portions PD1 and the number of the second pad portions PD2 are the same. For example, twelve first pad portions PD1 and twelve second pad portions PD2 may be alternately arranged.

Hereinafter, the first pad portion PD1 will be described with reference to FIG. 2.

As illustrated in FIG. 1 and FIG. 2, the first pad portion PD1 may include a first data pad portion 510, a second data pad portion 520, and a first control pad portion 410.

The first pad portion PD1 may include a first row L1a and a second row L2a. The second row L2a is positioned more inside the display device than the first row L1a. That is, the first row L1a is positioned closer to an edge of the display panel 100 than the second row L2a. The second row L2a is positioned closer to a center of the display panel 100 than the first row L1a.

The first data pad portion 510 is positioned in the first row L1a of the first pad portion PD1. The first data pad portion 510 may be positioned at a right side portion of the first row L1a. The first data pad portion 510 may include a plurality of first data pads 515. The first data pads 515 may be disposed in a row direction. The first data pads 515 may be separately disposed at a predetermined interval. A separation distance between the first data pads 515 may be constant. In an embodiment, and the separation distance between the first data pads 515 may be different from each other.

The second data pad portion 520 is positioned in the second row L2a of the first pad portion PD1. The second data pad portion 520 may be positioned at a right side portion of the second row L2a. The second data pad portion 520 may have substantially the same size as the first data pad portion 510. The second data pad portion 520 may be disposed in parallel with the first data pad portion 510 so that they are vertically adjacent from each other. In this case, the left edge of the second data pad portion 520 may be aligned with the left edge of the first data pad portion 510. In addition, the right edge of the second data pad portion 520 may be aligned with the right edge of the first data pad portion 510. In an embodiment, the size of the second data pad portion 520 may be different from that of the first data pad portion 510. The second data pad portion 520 may be disposed to be vertically adjacent to the first data pad portion 510. In this case, at least one of opposite edges of the second data pad portion 520 may not be aligned with opposite edges of the first data pad portion 510.

The second data pad portion 520 may include a plurality of second data pads 525. The second data pads 525 may be disposed in a row direction. The second data pads 525 may be separated from each other at a predetermined interval. A separation distance between the second data pads 525 may be constant. In an embodiment, and the separation distance between the second data pads 525 may be different from each other.

The first control pad portion 410 is positioned in the second row L2a of the first pad portion PD1. The first control pad portion 410 may be positioned at a left side portion of the second row L2a. The first control pad portion 410 may be positioned on a left side of the second data pad portion 520 in the second row L2a. The size of the first control pad portion 410 may be smaller than each of that of the first data pad portion 510 and the second data pad portion 520. In an embodiment, the size of the first control pad portion 410 may be larger than that of the second data pad portion 520.

The first control pad portion 410 may include a plurality of first control pads 415. The first control pads 415 may be disposed in a row direction. The first control pads 415 may be separated from each other at a predetermined interval. In an embodiment, the separation distance between the first control pads 415 may be different from each other.

The first pad portion PD1 may further include a plurality of first alignment keys 310 and a plurality of second alignment keys 320.

A first alignment key 310 may be positioned at a left side of the first data pad portion 510 in the first row L1a of the first pad portion PD1. A first alignment key 310 may be positioned adjacent to the first control pad portion 410. A first alignment key 310 is positioned above the first control pad portion 410. A first alignment key 310 may be additionally positioned at a right side of the first data pad portion 510 in the first row L1a of the first pad portion PD1. As a result, first alignment keys 310 may be positioned at opposite sides of the first data pad portion 510 in the first row L1a of the first pad portion PD1.

Second alignment keys 320 may be positioned at a left edge and a right edge of the first pad portion PD1. As a result, second alignment keys 320 may be positioned at opposite edges of the first pad portion PD1. Second alignment key 320 are positioned more outside the first pad portion PD1 than the first alignment key 310 (e.g., closer to an edge of first pad portion PD1 in a row direction). Some of the plurality of second alignment keys 320 may be positioned in the first row L1a of the first pad portion PD1, and others may be positioned in the second row L2a of the first pad portion PD1. In an embodiment, all of the second alignment keys 320 may be positioned in the first row L1a of the first pad portion PD1. In addition, all the second alignment keys 320 may be positioned in the second row L2b of the first pad portion PD1.

Hereinafter, the second pad portion PD2 will be described with reference to FIG. 3.

As illustrated in FIG. 1 and FIG. 3, the second pad portion PD2 may include a third data pad portion 530, a fourth data pad portion 540, and a second control pad portion 420.

The second pad portion PD2 may include two rows L1b and L2b. The two rows L1b and L2b may be formed of a first row L1b and a second row L2b. The second row L2b is positioned more inside the display device than the first row L1b. That is, the first row L1b is positioned closer to an edge of the display panel 100 than the second row L2b.

The third data pad portion 530 is positioned in the first row L1b of the second pad portion PD2. The third data pad portion 530 may be positioned at the left side portion of the first row L1b. The third data pad portion 530 may include a plurality of third data pads 535. The third data pads 535 may be disposed in a row direction. The third data pads 535 may be separated from each other at a predetermined interval. A separation distance between the third data pads 535 may be constant. In an embodiment, the separation distance between the third data pads 535 may be different.

The fourth data pad portion 540 is positioned in the second row L2b of the second pad portion PD2. The fourth data pad portion 540 may be positioned at a left side portion of the second row L2b. The fourth data pad portion 540 may have substantially the same size as the third data pad portion 530. The fourth data pad portion 540 may be disposed in parallel with the third data pad portion 530 so that they are vertically adjacent to each other. The left edge of the fourth data pad portion 540 may be aligned with the left edge of the third data pad portion 530. In addition, the right edge of the fourth data pad portion 540 may be aligned with the right edge of the third data pad portion 530. In an embodiment, the size of the fourth data pad portion 540 may be different from that of the third data pad portion 530. The fourth data pad portion 540 may be disposed to be vertically adjacent to the third data pad portion 530. In this case, at least one of opposite edges of the fourth data pad portion 540 may not be aligned with opposite edges of the third data pad portion 530.

The fourth data pad portion 540 may include a plurality of fourth data pads 545. The fourth data pads 545 may be disposed in a row direction. The fourth data pads 545 may be separated from each other at a predetermined interval. A separation distance between the fourth data pads 545 may be constant. In an embodiment, the separation distance between the fourth data pads 545 may be different.

The second control pad portion 420 is positioned in the second row L2b of the second pad portion PD2. The second control pad portion 420 may be positioned at a right side portion of the second row L2b. The second control pad portion 420 may be positioned on a right side of the fourth data pad portion 540 in the second row L2b. The size of the second control pad portion 420 may be smaller than each size of the third data pad portion 530 and the fourth data pad portion 540. In an embodiment, the size of the second control pad portion 420 may be larger than that of the fourth data pad portion 540.

The second control pad portion 420 may include a plurality of second control pads 425. The second control pads 425 may be disposed in a row direction. The second control pads 425 may be separated from each other at a predetermined interval. In an embodiment, the separation distance between the second control pads 425 may be different.

The second pad portion PD2 may further include a plurality of third alignment keys 330 and a plurality of fourth alignment keys 340.

A third alignment key 330 may be positioned at a left side of the third data pad portion 530 in the first row L1b of the second pad portion PD2. A third alignment key 330 may be positioned adjacent to the second control pad portion 420. In this case, the third alignment key 330 is positioned above the second control pad portion 420. A third alignment key 330 may be additionally positioned at a left side of the second pad portion PD2 in the first row L1b of the second pad portion PD2. As a result, third alignment keys 330 may be positioned at opposite sides of the third data pad portion 530 in the first row L1b of the second pad portion PD2.

Fourth alignment keys 340 may be positioned at a left edge and a right edge of the second pad portion PD2. As a result, fourth alignment keys 340 may be positioned at opposite edges of the second pad portion PD2. Fourth alignment key 340 are positioned more outside the second pad portion PD2 than the third alignment key 330. Some of the plurality of fourth alignment keys 340 may be positioned in the first row L1b of the second pad portion PD2, and others may be positioned in the second row L2b of the second pad portion PD2. In an embodiment, all of the fourth alignment keys 340 may be positioned in the first row L1b of the second pad portion PD2. In addition, all the fourth alignment keys 340 may be positioned in the second row L2b of the second pad portion PD2.

A structure of the second pad portion PD2 may be symmetrical with a structure of the first pad portion PD1. The first pad portion PD1 and the second pad portion PD2 may be symmetrical with respect to a virtual center line positioned between the first pad portion PD1 and the second pad portion PD2. The first data pad portion 510 of the first pad portion PD1 and the third data pad portion 530 of the second pad portion PD2 may be symmetrical. The second data pad portion 520 of the first pad portion PD1 and the fourth data pad portion 540 of the second pad portion PD2 may be symmetrical. The first control pad portion 410 of the first pad portion PD1 and the second control pad portion 420 of the second pad portion PD2 may be symmetrical. Positions of the first alignment key 310 of the first pad portion PD1 and the third alignment key 330 of the second pad portion PD2 may be symmetrical. Positions of the second alignment key 320 of the first pad portion PD1 and the fourth alignment key 340 of the second pad portion PD2 may be symmetrical.

Hereinafter, a connection relationship between the first pad portion PD1 and the second pad portion PD2 and other constituent elements will be described.

As described above, the pixels PX may be positioned in the display area DA of the display panel 100. The pixels PX may be disposed in a matrix form along a row direction and the column direction. A switching element and a pixel electrode connected to the switching element may be formed in each of the pixels PX.

A plurality of gate lines 121 and a plurality of data lines 171 may be further disposed in the display area DA of the display panel 100. The gate lines 121 and the data line 171 are connected with the pixels PX. For example, one pixel PX may be connected to one gate line 121 and one data line 171. In this case, the gate line 121 and the data line 171 may be connected to the pixel PX through a switching element. The switching element, which is an electrical element such as a thin film transistor integrated on the display panel 100, may include a gate terminal, an input terminal, and an output terminal. The switching element may be turned on or off by the gate signal that is inputted into the gate line 121, to selectively transfer a data voltage that is inputted into the data line 171 to the pixel electrode. The luminance of each pixel PX may be controlled by adjusting a data voltage applied to the pixel electrode, thereby displaying a predetermined image.

The gate line 121 may transfer a gate signal. The gate lines 121 may extend substantially in a row direction, and may be substantially parallel to each other. One gate line 121 may be connected to the pixels PX of two rows. For example, the uppermost gate line 121 may be connected to the pixel PX of the first row and the pixel PX of the second row. In this case, the gate line 121 may be located between the pixel PX of the first row and the pixel PX of the second row. The gate line 121 may be connected to the pixel PX positioned above the gate line 121, and may be connected to the pixel PX positioned below the gate line 121. That is, one gate line 121 may control the pixels PX of two rows.

The data line 171 may transfer a data voltage corresponding to an image signal. The data lines 171 may extend substantially in a column direction, and may be substantially parallel to each other. The data line 171 may include a first data line 171a and a second data line 171b. The first data line 171a and the second data line 171b may be disposed on opposite sides of one pixel PX. For example, the first data line 171a may be positioned at a left side of one pixel, and the second data line 171b may be positioned at a right side of the pixel. That is, a pair of data lines 171a and 171b are positioned at opposite sides with respect to one pixel column. Accordingly, the first data line 171a and the second data line 171b are positioned between two pixels PX that are adjacent in the row direction. In this case, the pixels PX in odd-numbered rows may be connected to the first data line 171a, and the pixels PX in even-numbered rows may be connected to the second data line 171b. In an embodiment, the pixels PX in the odd-numbered rows may be connected to the second data line 171b, and the pixels PX in the even-numbered rows may be connected to the first data line 171a. In addition, only one data line 171 may be positioned between two pixels PX adjacent in the row direction.

The gate line 121 and the data line 171 positioned in the display area DA may extend to the peripheral area PA.

A gate driver 400 may be further disposed in the peripheral area PA of the display panel 100. The gate line 121 extending to the peripheral area PA may be connected to the gate driver 400. The gate driver 400 may be formed directly in the peripheral area PA of the display panel 100 together with electrical elements such as a thin film transistor of the display area DA through a same process. The gate driver 400 may include a first gate driver 400a and a second gate driver 400b. The first gate driver 400a and the second gate driver 400b may be disposed adjacent to opposite sides of the display area DA. For example, the first gate driver 400a may be disposed to be adjacent to a left edge of the display area DA. The second gate driver 400b may be disposed to be adjacent to a right edge of the display area DA.

The first gate driver 400a and the second gate driver 400b may be connected to the gate line 121. Each of the first gate driver 400a and the second gate driver 400b may include a plurality of stages. Corresponding stages of the first gate driver 400a and the second gate driver 400b may be connected to a same gate line 121 to apply a same gate signal. As such, even when the display panel 100 is relatively large, display errors due to delayed gate signal may be prevented by applying a gate signal to a gate line 121 from the opposite sides of the display panel 100. In an embodiment, the gate driver 400 may be configured as a single gate driver. In this case, the gate driver 400 may be disposed to be adjacent to only one side of the display area DA.

The gate driver 400 may be connected to a control signal line 125. The control signal line 125 may include a first control signal line 125a and a second control signal line 125b. The first control signal line 125a may be connected to the first gate driver 400a and the second control signal line 125b may be connected to the second gate driver 400b. The gate driver 400 may receive a clock signal, a low voltage signal, a scanning start signal, and the like through the control signal line 125. The gate driver 400 may generate a gate signal through signals received through the control signal line 125 to output the gate signal to the gate line 121.

The control signal line 125 may be connected to the first pad portion PD1 and/or the second pad portion PD2. The first control signal line 125a may be connected to the first pad portion PD1. In this case, the first control signal line 125a may be connected to the first control pad portion 410 of the first pad portion PD1. The first control pad portion 410 may receive a clock signal, a low voltage signal, a scan start signal, and the like to transfer the same to the first control signal line 125a. The second control signal line 125b may be connected to the second pad portion PD2. In this case, the second control signal line 125b may be connected to the second control pad portion 420 of the second pad portion PD2. The second control pad portion 420 may receive a clock signal, a low voltage signal, a scan start signal, and the like to transfer the signal to the second control signal line 125b.

A common signal line, a storage electrode line, and the like may be further disposed in the display area DA. The common signal line, the storage electrode line, and the like may be connected to each pixel PX to transfer, respectively, a common voltage, a storage voltage, and the like. At least some of the plurality of first control pad portions 410 may be connected to a common signal line, a storage electrode line, etc. At least some of the plurality of second control pad portions 420 may be connected to a common signal line, a storage electrode line, etc. The first control pad portions 410 and the second control pad portions 420 may receive a common voltage, a storage voltage, and the like to transfer them to, respectively, a common voltage line, a storage electrode line, and the like.

Such a clock signal, a low voltage signal, a scan start signal, a common voltage, a storage voltage, and the like may be collectively referred to as a control signal. The first control pad portion 410 and the second control pad portion 420 may receive various control signals to transfer various control signals to various signal lines connected to the first control pad portion 410 and the second control pad portion 420. The pad portion receiving the control signal may be collectively referred to as a control pad portion 450. The control pad portion 450 may include a first control pad portion 410 and a second control pad portion 420.

The data line 171 extending to the peripheral area PA may be connected to the first pad portion PD1. The first data line 171a may be connected to the second data pad portion 520 of the first pad portion PD1, and the second data line 171b may be connected to the first data pad portion 510 of the first pad portion PD1. In an embodiment, the first data line 171a may be connected to the first data pad 510 of the first pad portion PD1, and the second data line 171b may be connected to the second data pad portion 520 of the first pad portion PD1.

In addition, the data line 171 extending to the peripheral area PA may be connected to the second pad portion PD2. The first data line 171a may be connected to the third data pad portion 530 of the second pad portion PD2, and the second data line 171b may be connected to the fourth data pad portion 540 of the second pad portion PD2. In an embodiment, the first data line 171a may be connected to the fourth data pad portion 540 of the second pad portion PD2, and the second data line 171b may be connected to the third data pad portion 530 of the second pad portion PD2.

The first data pad portion 510 and the second data pad portion 520 of the first pad portion PD1 may receive a data voltage to transfer the data voltage to the data line 171. In addition, the third data pad portion 530 and the fourth data pad portion 540 of the second pad portion PD2 may receive a data voltage to transfer the data voltage to the data line 171. The pad portion receiving the data voltage may be collectively referred to as a data pad portion 550. The data pad portion 550 may include a first data pad portion 510, a second data pad portion 520, a third data pad portion 530, and a fourth data pad portion 540.

In an embodiment, the data pad portion 550 is positioned in the first row L1a and the second row L2a of the first pad portion PD1. In addition, the data pad portion 550 is positioned in the first row L1b and the second row L2b of the second pad portion PD2. A portion of the control pad portion 450 is positioned only at a left side and not at a right side of the second data pad portion 520 in the second row L2a of the first pad portion PD1. A portion of the control pad portion 450 is positioned only at a right side and not a left side of the fourth data pad portion 540 in the second row L2b of the second pad portion PD2.

As such, the data pad portion 550 may be disposed in two rows in each of the first pad portion PD1 and the second pad portion PD2, and the control pad portion 450 may be disposed at only one of the left and right sides of the first pad portion PD1 and the second pad portion PD2, thereby reducing widths of the first pad portion PD1 and the second pad portion PD2. Accordingly, an interval between the first pad portion PD1 and the second pad portion PD2 can be widened, securing sufficient space for fastening screws coupling other components to the display panel 100. In addition, intervals between the first data pads 515 positioned in the first pad portion PD1, between the second data pads 525, and between the first control pads 415 may all be widened, thereby preventing a short-circuit from occurring when other parts are coupled to the first pad portion PD1. In addition, intervals between the first data pads 535 positioned in the second pad portion PD2, between the fourth data pads 545, and between the second control pads 425 may all be widened, thereby preventing a short-circuit from occurring when other parts are coupled to the second pad portion PD2.

In an embodiment, the control pad portion 450 is positioned only in the second row L2a of the first pad portion PD1 and not in the first row L1a of the first pad portion PD1. The control pad portion 450 is positioned only in the second row L2b of the second pad portion PD2 and not in the first row L1b of the second pad portion PD2.

As such, a space above the control pad portion 450 may be used for purposes other than accommodating the control pad portion 450. When the control pad portion 450 is disposed in two rows of the first pad portion PD1 and the second pad portion PD2, widths of the first pad portion PD1 and the second pad portion PD2 become wider than in present embodiments in order to form an alignment key. In embodiments of the present inventive concept, the widths of the first pad portion PD1 and the second pad portion PD2 may be reduced by disposing a first alignment key 310 and a third alignment key 330 in the space above the control pad portion 450. Accordingly, an interval between the first pad portion PD1 and the second pad portion PD2 can be widened, securing sufficient space for fastening screws that couple other components to the display panel 100.

In an embodiment, the first row L1a of the first pad portion PD1 and the first row L1b of the second pad portion PD2 are adjacent in the row direction. Accordingly, the first data pad portion 510 positioned in the first row L1a of the first pad portion PD1 may be adjacent to the third data pad portion 530 positioned in the first row L1b of the second pad portion PD2. Further, the second row L2a of the first pad portion PD1 and the second row L2b of the second pad portion PD2 are adjacent in the row direction. Accordingly, the second data pad portion 520 positioned in the second row L2a of the first pad portion PD1 may be adjacent to the fourth data pad portion 540 positioned in the second row L2b of the second pad portion PD2. In addition, the first control pad portion 410 positioned in the second row L2a of the first pad portion PD1 may be adjacent to the second control pad portion 420 positioned in the second row L2b of the second pad portion PD2.

Hereinafter, the display device after the first to fourth printed circuit films are attached thereto according to the embodiment will be described with reference to FIG. 4 to FIG. 6.

FIG. 4 illustrates a block diagram of a display device according to an embodiment, FIG. 5 illustrates an enlarged view of a first pad portion and a peripheral portion thereof in a display device according to an embodiment, and FIG. 6 illustrates an enlarged view of a second pad portion and a peripheral portion thereof in a display device according to an embodiment.

As illustrated in FIG. 4, a display device according to an embodiment may include a display panel 100, and a first printed circuit film 660 and a second printed circuit film 670 attached to edges of the display panel 100.

The first printed circuit film 660 may overlap the first pad portion PD1, and the second printed circuit film 670 may overlap the second pad portion PD2. A plurality of first pad portions PD1 and a plurality of second pad portions PD2 may be alternately positioned in the peripheral area PA of the display panel 100. Accordingly, a plurality of first printed circuit films 660 and a plurality of second printed circuit films 670 may be alternately disposed in one direction. The first printed circuit films 660 may be positioned at the left edge of the peripheral area PA positioned above the display area DA. The second printed circuit films 670 may be positioned adjacent to the right side of the first printed circuit film 660. Subsequently, the first printed circuit films 660 and the second printed circuit films 670 may be sequentially alternately arranged. In this case, the second printed circuit film 670 may be positioned at the right edge of the peripheral area PA positioned above the display area DA. The disposal shape of the first printed circuit films 660 and the second printed circuit films 670 may vary depending on the disposal form of the first pad portion PD1 and the second pad portion PD2.

The display device according to an embodiment may further include a printed circuit board 700 and a signal controller 750 disposed on the printed circuit board 700.

The printed circuit board 700 may be connected to the first printed circuit films 660 and the second printed circuit films 670. The printed circuit board 700 may be disposed adjacent to one edge of the display panel 100. In particular, the printed circuit board 700 may be disposed adjacent to an edge of the display panel 100 to which the first printed circuit films 660 and the second printed circuit films 670 are attached.

The signal controller 750 may receive an input image signal and an input control signal for controlling the display thereof from an external graphics controller. The signal controller 750 may be electrically connected to the first printed circuit films 660 and the second printed circuit films 670. Accordingly, the signal controller 750 may transfer a predetermined signal to the display panel 100 through the first printed circuit films 660 and the second printed circuit films 670.

Hereinafter, the first printed circuit film 660 will be described with reference to FIG. 5.

As illustrated in FIG. 4 and FIG. 5, the first printed circuit film 660 may include a first film 610 and a second film 620.

The first film 610 and the second film 620 may each have a pentagonal shape including two sides parallel to the upper edge of the display panel 100, two sides perpendicular thereto, and oblique diagonal sides thereto.

The first film 610 may overlap the first data pad portion 510. The first film 610 may cover at least a part of the first row L1a of the first pad portion PD1. The first film 610 may not overlap the second row L2a of the first pad portion PD1. The first film 610 may not cover the second data pads 525 and the first control pads 415 disposed in the first pad portion PD1.

The first film 610 may include a first data driver IC 615. The first data driver IC 615 may be connected to the signal controller 750 through wires or the like, and may be connected to the first data pads 515 of the first data pad portion 510. Accordingly, the first data driver IC 615 may receive an input image signal from the signal controller 750 to generate a data voltage. In addition, the data voltage generated by the first data driver IC 615 may be transferred to the data line 171 through the first data pads 515.

The first film 610 may further include a first film alignment key 617. The first film alignment key 617 may be aligned with the first alignment key 310 of the first pad portion PD1. Accordingly, the first film 610 may overlap the first alignment key 310. The position and shape of the first film alignment key 617 may be changed depending on the position and shape of the first alignment key 310.

The second film 620 may overlap the second data pad portion 520 and the first control pad portion 410. The second film 620 may be disposed to cover at least a part of the second row L2a of the first pad portion PD1. Since the first row L1a of the first pad portion PD1 is positioned more outside the display panel 100 than the second row L2a, and the second film 620 is connected to the printed circuit board 700, the second film 620 may cover at least a part of the first row L1a of the first pad portion PD1.

The second film 620 may include a second data driver IC 625. Although not illustrated, the second data driver IC 625 may be connected to the signal controller 750 through wires or the like, and may be connected to the second data pads 525 of the second data pad portion 520. Accordingly, the second data driver IC 625 may receive an input image signal from the signal controller 750 to generate a data voltage. In addition, a second data voltage generated by the first data driver IC 625 may be transferred to the data line 171 through the second data pads 525.

The second film 620 may further include a second film alignment key 627. The first second alignment key 627 may be aligned with the second alignment key 320 of the first pad portion PD1. Accordingly, the second film 620 may overlap the second alignment key 320. Positions and shapes of the second alignment key 320 and the second film alignment key 627 may be changed in various ways. The position and shape of the second film alignment key 627 may be changed depending on the position and shape of the second alignment key 320.

Hereinafter, the second printed circuit film 670 will be described with reference to FIG. 6.

As illustrated in FIG. 4 and FIG. 6, the second first printed circuit film 670 may include a third film 630 and a fourth film 640.

The third film 630 and the fourth film 640 may be formed to have a pentagonal shape including two sides parallel to the upper edge of the display panel 100, two sides perpendicular thereto, and oblique diagonal sides thereto. However, a form of the third film 630 and the fourth film 640 are just one example, and the present embodiment is not limited thereto.

The third film 630 may overlap the third data pad portion 530. The third film 630 may be disposed to cover at least a part of the first row L1b of the second pad portion PD2. The third film 630 may not overlap the second row L2b of the second pad portion PD2. The third film 630 may be disposed to not cover the fourth data pads 545 and the second control pads 425 disposed in the second pad portion PD2.

The third film 630 may include a third data driver IC 635. Although not illustrated, the third data driver IC 635 may be connected to the signal controller 750 through wires or the like, and may be connected to the third data pads 535 of the third data pad portion 530. Accordingly, the third data driver IC 635 may receive an input image signal from the signal controller 750 to generate a data voltage. In addition, a third data voltage generated by the first data driver IC 635 may be transferred to the data line 171 through the third data pads 535.

The third film 630 may further include a third film alignment key 637. The third alignment key 637 may be aligned with the third alignment key 330 of the second pad portion PD2. Accordingly, the third film 630 may overlap the third alignment key 330. Positions and shapes of the third alignment key 330 and the third film alignment key 637 may be changed in various ways. The position and shape of the third film alignment key 637 may be changed depending on the position and shape of the third alignment key 330.

The fourth film 640 may overlap the fourth data pad portion 540 and the second control pad portion 420. The fourth film 640 may be disposed to cover at least a part of the second row L2b of the second pad portion PD2. Since the first row L1b of the second pad portion PD2 is positioned more outside (e.g., closer to an edge of) the display panel 100 than the second row L2b, and the fourth film 640 is connected to the printed circuit board 700, the fourth film 640 may cover at least a part of the first row L1b of the second pad portion PD2.

The fourth film 640 may include a fourth data driver IC 645. The fourth data driver IC 645 may be connected to the signal controller 750 through wires or the like, and may be connected to the fourth data pads 545 of the fourth data pad portion 540. Accordingly, the fourth data driver IC 645 may receive an input image signal from the signal controller 750 to generate a data voltage. In addition, a fourth data voltage generated by the first data driver IC 645 may be transferred to the data line 171 through the fourth data pads 545.

The fourth film 640 may further include a fourth film alignment key 647. The fourth alignment key 647 may be aligned with the fourth alignment key 340 of the second pad portion PD2. Accordingly, the fourth film 640 may overlap the fourth alignment key 340. The position and shape of the fourth film alignment key 647 may be changed depending on the position and shape of the fourth alignment key 340.

In an embodiment, the shape of the third film 630 may be substantially the same as that of the first film 610. The shape and row position of the first film alignment key 617 of the first film 610 may be substantially the same as those of the third film alignment key 637 of the third film 630. A lower central portion of the first film 610 overlaps the first data pad portion 510, and a lower central portion of the third film 630 overlaps the third data pad portion 530. Accordingly, the first film 610 and the third film 630 are compatible.

In an embodiment, the control pad portion 450 is positioned only in a lower row of two rows of the first pad portion PD1 and the second pad portion PD2, thereby allowing the first film 610 and the third film 630 to be compatible. When the control pad portion 450 is positioned in two rows of the first pad portion PD1 and the second pad portion PD2, shapes of the first film 610 and the third film 630 are altered to become incompatible.

The display device according to embodiments of the present inventive concept includes four films including the first film 610, the second film 620, the third film 630, and the fourth film 640. Since the first film 610 and the third film 630 are compatible, only three different types of films need to be manufactured. Therefore, the process cost can be reduced compared with producing four completely different types of films.

Next, a display device according to an embodiment will be described with reference to FIG. 7.

Figure 7:
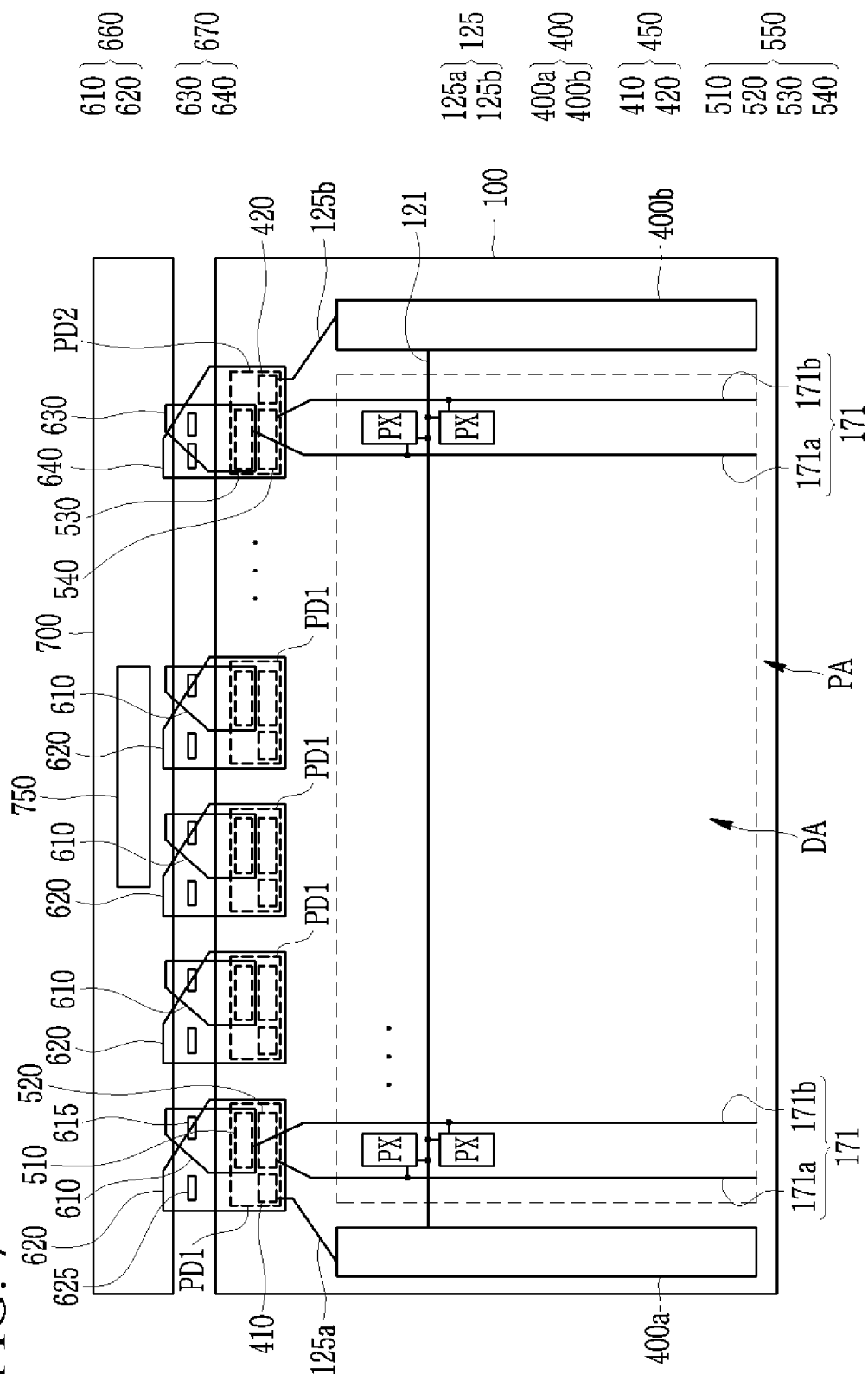
FIG. 7 illustrates a schematic block diagram of a display device according to an embodiment.

Since the display device according to the embodiment illustrated in FIG. 7 is substantially the same as the display device according to the embodiment shown in FIG. 1 to FIG. 6, a description of the same parts will be omitted. The present embodiment differs from the previous embodiment in that there is a place where the first pad portion is continuously disposed, and this will be described further below.

FIG. 7 illustrates a schematic block diagram of a display device according to an embodiment.

As illustrated in FIG. 7, the display device according to an embodiment includes a display panel 100, a first pad portion PD1 and a second pad portion PD2 positioned in the peripheral area PA of the display panel 100, a first printed circuit film 660 overlapping the first pad portion PD1, and a second printed circuit film 670 overlapping the second pad portion PD2.

A plurality of first pad portions PD1 and a plurality of second pad portions PD2 may be positioned in the peripheral area PA of the display panel 100. That is, the display device may include a plurality of first pad portions PD1 and a plurality of second pad portions PD2. The first pad portion PD1 may be positioned at a left edge of the peripheral area PA positioned above the display area DA. Another first pad portion PD1 may be positioned adjacent to the first pad portion PD1. That is, the first pad portion PD1 may be continuously positioned along one direction. The second pad portion PD2 may be positioned at a right edge of the peripheral area PA positioned above the display area DA. That is, the first pad portion PD1 may be continuously positioned in a line, and the second pad portion PD2 may be positioned only at an end. In an embodiment, the first pad portion PD1 may be continuously positioned in a line, and the first pad portion PD1 and the second pad portion PD2 may be alternately positioned in some areas.

Since the first printed circuit film 660 overlaps the first pad portion PD1, the first printed circuit film 660 may also continue in a line at a region where the first pad portion PD1 is continuously positioned in a line. At the end of the line, the second printed circuit film 670 may also be positioned at a region where the second pad portion PD2 is positioned.

Next, a display device according to an embodiment will be described with reference to FIG. 8.

Figure 8:
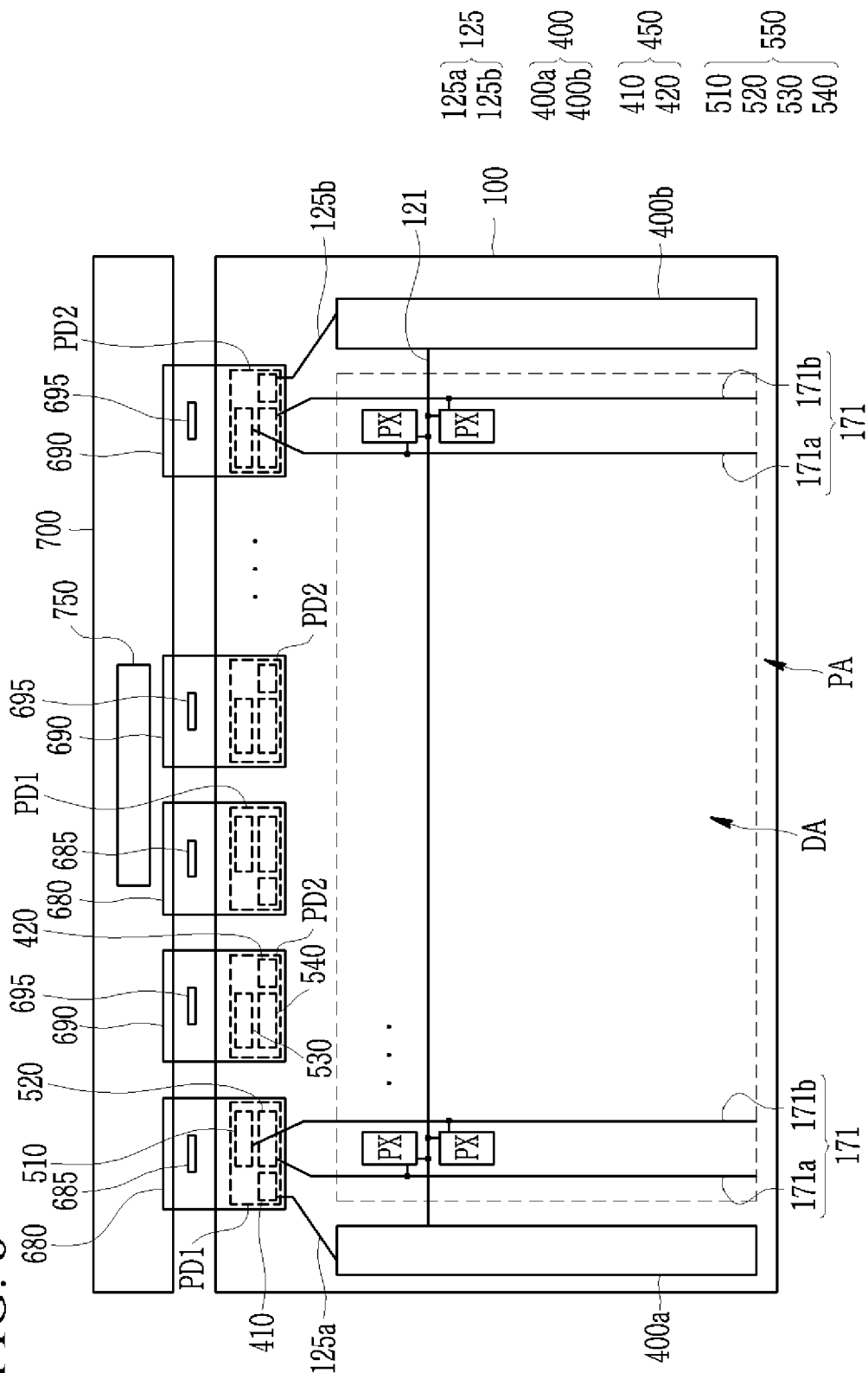
FIG. 8 illustrates a schematic block diagram of a display device according to an embodiment.

Since the display device according to the embodiment illustrated in FIG. 8 is substantially the same as the display device according to the embodiment shown in FIG. 1 to FIG. 6, a description of the same parts will be omitted.

FIG. 8 illustrates a schematic block diagram of a display device according to an embodiment.

As illustrated in FIG. 8, the display device according to an embodiment includes a display panel 100, a first pad portion PD1 and a second pad portion PD2 positioned in the peripheral area PA of the display panel 100, a first printed circuit film 680 overlapping the first pad portion PD1, and a second printed circuit film 690 overlapping the second pad portion PD2.

The first printed circuit film 680 does not include a plurality of films, but may be formed as a single film (e.g., a film having only a single layer). The first printed circuit film 680 may be formed to have a rectangular shape including two sides parallel to an upper edge of the display panel 100 and two sides perpendicular to the upper edge. The first printed circuit film 680 may overlap the first data pad portion 510, the second data pad portion 520, and the first control pad portion 410 of the first pad portion PD1.

The second printed circuit film 690 does not include a plurality of films, but may be formed as a single film. The second printed circuit film 690 may be formed to have a rectangular shape including two sides parallel to an upper edge of the display panel 100 and two sides perpendicular to the upper edge. The second printed circuit film 690 may overlap the third data pad portion 530, the fourth data pad portion 540, and the second control pad portion 420 of the second pad portion PD2.

Although the first printed circuit film 680 and the second printed circuit film 690 have been described as being formed as a single film, in an embodiment, at least one of the first printed circuit film 680 and the second printed circuit film 690 may include a plurality of films.

Next, a display device according to an embodiment will be described with reference to FIG. 9.

Figure 9:
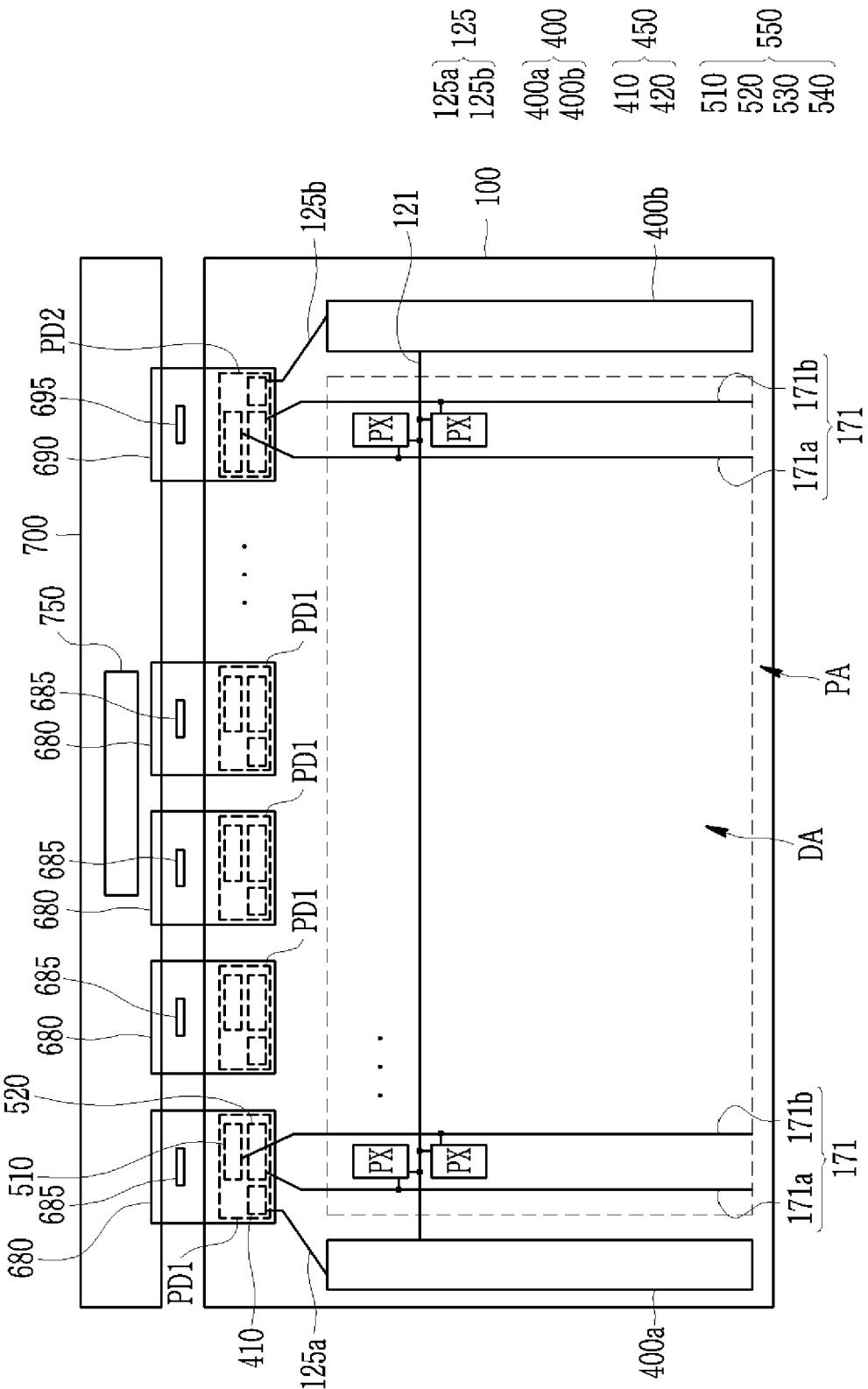
FIG. 9 illustrates a block diagram of a display device according to an embodiment.

Since the display device according to the embodiment illustrated in FIG. 9 is substantially the same as the display device according to the embodiment shown in FIG. 8, a description of the same parts will be omitted.

FIG. 9 illustrates a block diagram of a display device according to an embodiment.

As illustrated in FIG. 9, the display device according to an embodiment includes a display panel 100, a first pad portion PD1 and a second pad portion PD2 positioned in the peripheral area PA of the display panel 100, a first printed circuit film 680 overlapping the first pad portion PD1, and a second printed circuit film 690 overlapping the second pad portion PD2.

A plurality of first pad portions PD1 and a plurality of second pad portions PD2 may be positioned in the peripheral area PA of the display panel 100. The first pad portion PD1 may be continuously positioned from the left edge of the peripheral area PA positioned above the display area DA. The second pad portion PD2 may be positioned at a right edge of the peripheral area PA positioned above the display area DA. That is, the first pad portion PD1 may be continuously positioned in a line, and the second pad portion PD2 may be positioned only at an end of the line.

Since the first printed circuit film 680 overlaps the first pad portion PD1, the first printed circuit film 680 may also continue in a line at a region where the first pad portion PD1 is continuously positioned in a line. At the end of the line, the second printed circuit film 690 may also be positioned at a region where the second pad portion PD2 is positioned. The first printed circuit film 680 may be formed as a single film, and the second printed circuit film 690 may be formed as a single film.

Next, a structure of two adjacent pixels of the display device according to an embodiment will be described with reference to FIG. 10. Two pixels that are vertically adjacent are illustrated, and for convenience of description, a pixel positioned at an upper side is referred to as a first pixel PX1 and a pixel positioned at a lower side is referred to as a second pixel PX2.

Figure 10:
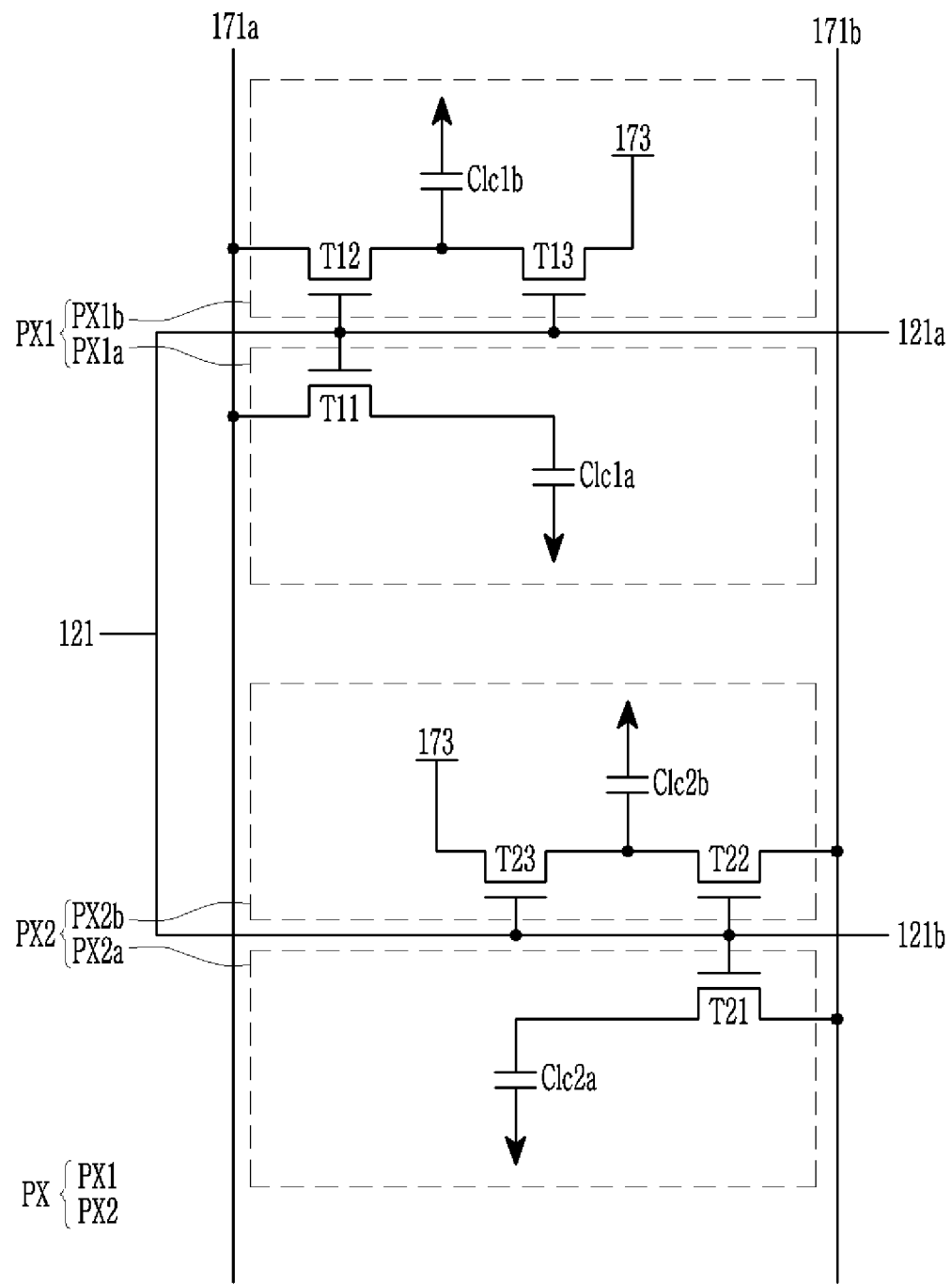
FIG. 10 illustrates an equivalent circuit diagram of two adjacent pixels of a display device according to an embodiment.

FIG. 10 illustrates an equivalent circuit diagram of two adjacent pixels of a display device according to an embodiment.

As illustrated in FIG. 10, the first pixel PX1 and the second pixel PX2 are vertically adjacent to each other. The first pixel PX1 and the second pixel PX2 may include first subpixels PX1a and PX2a and second subpixels PX1b and PX2b, respectively.

The gate line 121 may be branched into a first gate line 121a and a second gate line 121b to which a same gate signal is applied. The data line 171 may include a first data line 171a and a second data line 171b to which different data voltages are applied. The first data line 171a may be positioned at a left side of the first pixel PX1 and the second pixel PX2, and the second data line 171b may be positioned at a right side of the first pixel PX1 and the second pixel PX2.

The first pixel PX1 may be formed of elements that are connected with the first gate line 121a and the first data line 171a. The first pixel PX1 may include a first transistor T11 and a second transistor T12 connected with the first gate line 121a and the first data line 171a. The first pixel PX1 may further include a third transistor T13 connected to the first gate line 121a, the second transistor T12, and a storage electrode line 173. A first liquid crystal capacitor Clc1a connected to the first transistor T11 may be positioned in the first subpixel PX1a of the first pixel PX1. A second liquid crystal capacitor Clc1b connected to the second transistor T12 may be positioned in the second subpixel PX1b of the first pixel PX1.

The first transistor T11 of the first pixel PX1 has a first terminal connected to the first gate line 121a, a second terminal connected to the first data line 171a, and a third terminal connected to the first liquid crystal capacitor Clc1a. The second transistor T12 of the first pixel PX1 has a first terminal connected to the first gate line 121a, a second terminal connected to the first data line 171a, and a third terminal connected to the second liquid crystal capacitor Clc1b. The third transistor T13 of the first pixel PX1 has a first terminal connected to the first gate line 121a, a second terminal connected to the storage electrode line 173, and a third terminal connected to the third terminal of the second transistor T12.

The second pixel PX2 may be formed of elements that are connected with the second gate line 121b and the second data line 171b. The second pixel PX2 may include a first transistor T21 and a second transistor T22 connected with the second gate line 121b and the second data line 171b. The second pixel PX2 may further include a third transistor T23 connected to the second gate line 121b, the second transistor T22, and the storage electrode line 173. A first liquid crystal capacitor Clc2a connected to the first transistor T21 may be positioned in the first subpixel PX2a of the second pixel PX2. A second liquid crystal capacitor Clc2b connected to the second transistor T22 may be positioned in the second subpixel PX2b of the second pixel PX2.

The first transistor T21 of the second pixel PX2 has a first terminal connected to the second gate line 121b, a second terminal connected to the second data line 171b, and a third terminal connected to the first liquid crystal capacitor Clc2a. The second transistor T22 of the second pixel PX2 has a second terminal connected to the second gate line 121b, a second terminal connected to the second data line 171b, and a third terminal connected to the second liquid crystal capacitor Clc2b. The third transistor T23 of the second pixel PX2 has a first terminal connected to the second gate line 121b, a second terminal connected to the storage electrode line 173, and a third terminal connected to the third terminal of the second transistor T22.

When a gate-on voltage is applied to the gate line 121, the gate-on voltage is simultaneously applied to the first gate line 121a and the second gate line 121b branching from the gate line 121. The first to third transistors T11, T12, and T13 of the first pixel PX1 connected to the first gate line 121a are simultaneously turned on, and the first to third transistors T21, T22, and T23 of the second pixel PX2 connected to the second gate line 121b are simultaneously turned on. The first liquid crystal capacitor Clc1a and the second liquid crystal capacitor Clc1b of the first pixel PX1 are charged by the data voltage transferred through the first data line 171a. The first liquid crystal capacitor Clc2a and the second liquid crystal capacitor Clc2b of the second pixel PX2 are charged by the data voltage transferred through the second data line 171b.

When the third transistor T13 of the first pixel PX1 is turned on, the data voltage transferred to the second subpixel PX1b through the first data line 171a is divided by the third transistor T13 connected in series with the second transistor T12. The voltage is distributed depending on sizes of channels of the second transistor T12 and the third transistor T13. Accordingly, even when the data voltages transferred to the first subpixel PX1a and the second subpixel PX1b through the first data line 171a are the same, voltages charged in the first liquid crystal capacitor Clc1a and the second liquid crystal capacitor Clc1b are different from each other. As a result, a voltage charged in the second liquid crystal capacitor Clc1b is lower than a voltage charged in the first liquid crystal capacitor Clc1a. As described above, side visibility may be improved by changing the voltages charged in the first subpixel PX1a and the second subpixel PX1b in the first pixel PX1.

When the third transistor T23 of the second pixel PX2 is turned on, the data voltage transferred to the second subpixel PX2b through the second data line 171b is divided by the third transistor T23 connected in series with the second transistor T22. In this case, the voltage is distributed depending on sizes of channels of the second transistor T22 and the third transistor T23. Accordingly, even when the data voltages transferred to the first subpixel PX2a and the second subpixel PX2b through the second data line 171b are the same, voltages charged in the first liquid crystal capacitor Clc2a and the second liquid crystal capacitor Clc2b are different from each other. As a result, a voltage charged in the second liquid crystal capacitor Clc2b is lower than a voltage charged in the first liquid crystal capacitor Clc2a. As described above, side visibility may be improved by changing the voltages charged in the first subpixel PX2a and the second subpixel PX2b in the second pixel PX2.

In the display area of the display device according to the embodiments illustrated in FIG. 1 to FIG. 9, the pixels illustrated in FIG. 10 may be repeatedly disposed.

As described above, in a structure in which a pair of data lines are positioned at opposite sides of one pixel row, about twice as many data lines may be disposed as in a structure in which only one data line is disposed at one side of one pixel row. In this case, a number of data pads also increases. In accordance with the display device according to the embodiments illustrated in FIG. 1 to FIG. 9, the interval between the pads may be ensured, and the process cost may be reduced while securing the interval between the films by appropriately configuring the first pad portion and the second pad portion positioned in two rows.

While this disclosure has been described in connection with what is presently considered to be practical embodiments, the inventive concept is not limited to the disclosed embodiments, but, on the contrary, is intended to cover various modifications and equivalent arrangements included within the spirit and scope of the disclosure.

DESCRIPTION OF SYMBOLS

125: control signal line
125a: first control signal line
125b: second control signal line
171: data line
171a: first data line
171b: second data line
310: first alignment key
320: second alignment key
330: third alignment key
340: fourth alignment key
400: gate driver
400a: first gate driver
400b: second gate driver
410: first control pad portion
415: first control pad
420: second control pad portion
425: second control pad
450: control pad portion
510: first data pad portion
515: first data pad
520: second data pad portion
525: second data pad
530: third data pad portion
535: third data pad
540: fourth data pad
545: fourth data pad
550: data pad portion
610: first film
620: second film
630: third film
640: fourth film
660, 680: first printed circuit film
670, 690: second printed circuit film

What is claimed is:

1. A display device comprising:
a display panel comprising a display area and a peripheral area disposed at an edge of the display area;
a data pad portion positioned on the peripheral area of the display panel and configured to transfer a data voltage; and
a control pad portion positioned on the peripheral area of the display panel and configured to transfer a control voltage,
wherein the data pad portion includes:
a first data pad portion positioned in a first row of the first pad portion;
a second data pad portion positioned in a second row below the first row of the first pad portion;
a third data pad portion positioned in a first row of a second pad portion adjacent to the first pad portion in a row direction; and
a fourth data pad portion positioned in a second row below the first row of the second pad portion, and
wherein the control pad portion includes:
a first control pad portion positioned at a left side of the second data pad portion in the second row of the first pad portion; and
a second control pad portion positioned at a right side of the fourth data pad portion in the second row of the second pad portion.

2. The display device of claim 1, wherein the first data pad portion is adjacent to the third data pad portion, and
wherein the second data pad portion is adjacent to the fourth data pad portion.

3. The display device of claim 2, wherein the control pad portion is not positioned in a first row of the first pad portion and not positioned in a first row of the second pad portion.

4. The display device of claim 3, wherein the control pad portion is not positioned at a right side of the second data pad portion in the second row of the first pad portion, and is not positioned at a left side of the second data pad portion in the second row of the second pad portion.

5. The display device of claim 1, wherein the first row of the first pad portion and the first row of the second pad portion are adjacent in a row direction, and wherein the second row of the first pad portion and the second row of the second pad portion are adjacent in the row direction.

6. The display device of claim 1, further comprising:
a first alignment key positioned at a left side of the first data pad portion, in the first row of the first pad portion, and adjacent to the first control pad portion.

7. The display device of claim 6, further comprising:
a second alignment key positioned at a right side of the third data pad portion, in the first row of the second pad portion, and adjacent to the second control pad portion.

8. The display device of claim 1, wherein the display device includes a plurality of first pad portions and a plurality of second pad portions, and
wherein the plurality of first pad portions and the plurality of second pad portions are alternately positioned in the row direction.

9. The display device of claim 8, wherein the second control pad portion of the second pad portion is adjacent to the first control pad portion of the first pad portion.

10. The display device of claim 9, wherein the first pad portion is positioned at a left edge of the peripheral area, and
wherein the second pad portion is positioned at a right edge of the peripheral area.

11. The display device of claim 10, wherein a sum of a number of the first pad portions and a number of the second pad portions is an even number.

12. The display device of claim 1, wherein the display device includes a plurality of first pad portions,
wherein the plurality of first pad portions are positioned in a line, and
wherein the second pad portion is positioned adjacent to edges of the first pad portions.

13. The display device of claim 12, wherein the second pad portion is positioned at a right edge of the peripheral area.

14. The display device of claim 1, further comprising:
a first printed circuit film overlapping the first pad portion; and
a second printed circuit film overlapping the second pad portion.

15. The display device of claim 14, wherein the first printed circuit film includes:
a first film overlapping the first data pad portion;
a second film overlapping the second data pad portion and the first control pad portion, and
the second printed circuit film includes:
a third film overlapping the third data pad portion; and
a fourth film overlapping the fourth data pad portion and the second control pad portion.

16. The display device of claim 14, wherein the first printed circuit film is formed as a single film, and
wherein the second printed circuit film is formed as a single film.

17. The display device of claim 1, wherein the control pad portion is configured to receive at least one of a clock signal, a low voltage signal, a scan start signal, a common voltage, and a storage voltage.

18. The display device of claim 17, wherein the data pad portion is configured to receive a data voltage.

19. The display device of claim 1, wherein a structure of the first pad portion is symmetric with respect to a structure of the second pad portion.

20. A display device comprising:
a display panel comprising a display area and a peripheral area disposed at an edge of the display area;
a first pad portion positioned on the peripheral area of the display panel; and
a second pad portion positioned on the peripheral area of the display panel to be adjacent to the first pad portion in a row direction, and to have a symmetrical structure with respect to the first pad portion,
wherein the first pad portion includes:
a first data pad portion positioned in a first row;
a second data pad portion positioned in a second row below a first row of the first pad portion to be adjacent to the first data pad portion; and
a first control pad portion positioned in the second row of the first pad portion and positioned at a left side of the second data pad portion, and
wherein the second pad portion includes:
a third data pad portion positioned in a first row;
a fourth data pad portion positioned in a second row below the first row of the second pad portion to be adjacent to the third data pad portion; and
a second control pad portion positioned in the second row of the second pad portion and positioned at a right side of the fourth data pad portion.

21. The display device of claim 20, wherein the first data pad portion is adjacent to the third data pad portion,
wherein the second data pad portion is adjacent to the fourth data pad portion,
wherein the first data pad portion and the second data pad portion are positioned at a right edge of the first pad portion, and
wherein the third data pad portion and the fourth data pad portion are positioned at a left edge of the second pad portion.

22. The display device of claim 20, further comprising:
a first alignment key positioned at a left side of the first data pad portion in the first row of the first pad portion to be adjacent to the first control pad portion; and
a second alignment key positioned at a right side of the third data pad portion in the first row of the second pad portion to be adjacent to the second control pad portion.

23. The display device of claim 20, further comprising:
a first printed circuit film overlapping the first pad portion; and
a second printed circuit film overlapping the second pad portion.

* * * * *